United States Patent [19]
Cohen

[11] Patent Number: 5,656,355
[45] Date of Patent: Aug. 12, 1997

[54] MULTILAYER ELASTIC METALLIZED MATERIAL

[75] Inventor: Bernard Cohen, Berkeley Lake, Ga.

[73] Assignee: Kimberly-Clark Corporation, Neenah, Wis.

[21] Appl. No.: 481,967

[22] Filed: Jun. 7, 1995

Related U.S. Application Data

[63] Continuation-in-part of Ser. No. 281,317, Jul. 27, 1994, abandoned, which is a continuation of Ser. No. 849,853, Mar. 12, 1992, abandoned.

[51] Int. Cl.$^6$ .............................. A32B 15/06; A32B 3/24
[52] U.S. Cl. ............... 428/138; 442/328; 442/379; 428/137; 428/143; 428/213; 428/220; 428/323; 428/325; 428/327; 428/147; 428/149; 428/334; 428/335; 428/336; 428/344; 428/457; 428/458; 428/460; 428/461; 428/462; 428/463; 428/464; 428/465; 428/466; 428/467
[58] Field of Search ..................... 428/137, 143, 428/213, 220, 323, 325, 327, 147, 149, 334, 335, 336, 344, 457, 458, 460, 461, 462, 463, 464, 465, 466, 467, 263, 230, 138, 242, 246, 285

[56] References Cited

U.S. PATENT DOCUMENTS

| | | | |
|---|---|---|---|
| 3,778,331 | 12/1973 | Scharf | 161/67 |
| 3,795,720 | 3/1974 | Schwarz | 264/41 |
| 3,967,367 | 7/1976 | Hayes et al. | 29/606 |
| 4,032,681 | 6/1977 | Jonnes | 428/253 |
| 4,100,324 | 7/1978 | Anderson et al. | 428/288 |
| 4,101,698 | 7/1978 | Dunning et al. | 428/31 |
| 4,204,942 | 5/1980 | Chahroudi | 204/298 |
| 4,209,563 | 6/1980 | Sisson | 478/288 |
| 4,305,981 | 12/1981 | Muroi et al. | 428/463 |
| 4,366,202 | 12/1982 | Borovsky | 428/283 |

(List continued on next page.)

FOREIGN PATENT DOCUMENTS

| | | |
|---|---|---|
| 0037235 | 10/1981 | European Pat. Off. . |
| 0076414 | 4/1983 | European Pat. Off. . |
| 0109167 | 5/1984 | European Pat. Off. . |
| 0239080 | 9/1987 | European Pat. Off. . |
| 0 185 480 | 6/1989 | European Pat. Off. . |
| 0365692 | 5/1990 | European Pat. Off. . |
| 0 392 082 | 10/1990 | European Pat. Off. . |
| 0392082 | 10/1990 | European Pat. Off. . |
| 9004662 | 5/1990 | WIPO . |

OTHER PUBLICATIONS

Japanese Abstract, vol. 9, No. 5 (C–260)(1728) 10 Jan. 1985 & JP-A-59 157 275 (Seikoo Kasei KK) 6 Sep. 1984 (Abstract).
Japanese Abstract, vol. 13, No. 24 (C–561)(3372) 19 Jan. 1989 & JP-A-63 227 761 (Hitachi Cable Ltd.) 22 Sep. 1988 (Abstract).
"Plastics Finishing and Decoration", written by Stats (1986), p. 340.
Japan Patent—JP 3019300 (Abstract) undated.
Japan Patent—JP 3011504 (Abstract) undated.
Japan Patent—JP 2235626 (Abstract) undated.
Japan Patent—JP 2274869 (Abstract) undated.

(List continued on next page.)

*Primary Examiner*—William Watkins
*Attorney, Agent, or Firm*—Karl V. Sidor

[57] ABSTRACT

Disclosed is an elastic metallized film composed of an elastic film and a metallic coating substantially covering at least a portion of at least one side of the film. The elastic film may be formed from a thermoset elastic material, a thermoplastic elastic material or a naturally occurring polymeric elastic material. The film may also be microporous and/or micropertured. The elastic metallized film has a metallic coating with an thickness ranging from about 1 nanometer to about 5 microns and which remains on the film when the film is stretched at least about 25 percent. The elastic metallized film may be joined with other materials to form multi-layer materials. Also disclosed is a process of making an elastic metallized film.

21 Claims, 6 Drawing Sheets

U.S. PATENT DOCUMENTS

| | | | |
|---|---|---|---|
| 4,656,081 | 4/1987 | Ando et al. | 428/233 |
| 4,663,220 | 5/1987 | Wisneski et al. | 428/221 |
| 4,715,235 | 12/1987 | Fukui et al. | 73/862.68 |
| 4,738,894 | 4/1988 | Borde | 428/283 |
| 4,741,949 | 5/1988 | Morman et al. | 428/224 |
| 4,765,323 | 8/1988 | Poettgen | 128/132 |
| 4,787,699 | 11/1988 | Moulin | 350/96.21 |
| 4,803,117 | 2/1989 | Paponte | 428/228 |
| 4,879,170 | 11/1989 | Radwanski et al. | 428/233 |
| 4,933,129 | 6/1990 | Huykman | 264/116 |
| 4,939,016 | 7/1990 | Rudwanski et al. | 428/152 |
| 4,965,098 | 10/1990 | Handa et al. | 428/31 |
| 4,965,122 | 10/1990 | Morman | 428/225 |
| 4,981,747 | 1/1991 | Morman | 428/198 |
| 4,999,222 | 3/1991 | Jones et al. | 427/250 |
| 5,055,338 | 10/1991 | Sheth et al. | 428/155 |
| 5,057,351 | 10/1991 | Jones et al. | 428/138 |
| 5,069,227 | 12/1991 | Maronian | 128/844 |
| 5,076,199 | 12/1991 | Kistrup | 118/52 |
| 5,113,874 | 5/1992 | Maronian | 128/844 |
| 5,114,781 | 5/1992 | Morman | 428/198 |
| 5,116,662 | 5/1992 | Morman | 428/198 |
| 5,135,797 | 8/1992 | Sasaki | 428/463 |

OTHER PUBLICATIONS

Japan Patent—JP 2101191 (Abstract) undated.
Japan Patent—JP 1171300 (Abstract) undated.
Japan Patent—JP 63295762 (Abstract) undated.
Japan Patent—JP 63024196 (Abstract) undated.
Japan Patent—JP 62170581 (Abstract) undated.
Japan Patent—JP 61146870 (Abstract) undated.
Japan Patent—JP 61146869 (Abstract) undated.
Japan Patent—JP 61132652 (Abstract) undated.
Japan Patent—JP 1073077 (Abstract) undated.
Japan Patent—JP 2118173 (Abstract) undated.
Japan Patent—JP 1199771 (Abstract) undated.
German Patent—DE 3925232 (Abstract) undated.
Romanian Patent—RO 96401 (Abstract) undated.
European Patent—EP 264771 (Abstract) undated.
European Patent—EP 185480 (Abstract) undated.
French Patent—FR 2345295 (Abstract) undated.
U.S. Patent—US 4933129 (Abstract) undated.
U.S. Patent—US 4765323 (Abstract) undated.
U.S. Patent—US 4889135 (Abstract) undated.
U.S. Patent—US 4738894 (Abstract) undated.
U.S. Patent—US 3778331 (Abstract) undated.
"Plasma– and Corona–Modified Polymer Surfaces", *Metallization of Polymers*, ACS Symposium Series 440, 1990, Chapter 5.
"Reactions of Metal Atoms with Monomers and Polymers", *Metallization of Polymers*, ACS Symposium Series 440, 1990, Chapter 18.

MULTILAYER ELASTIC METALLIZED MATERIAL

This application is a continuation-in-part of application Ser. No. 08/281,317 entitled "A Multilayer Elastic Material and Process to Make the Same" and filed in the U.S. Patent and Trademark Office on Jul. 27, 1994 abandoned, which is a continuation of application Ser. No. 07/849,853, filed on Mar. 12, 1992 abandoned.

FIELD OF THE INVENTION

This invention relates to metallized films and a process to prepare metallized films.

BACKGROUND OF THE INVENTION

Metallic coatings ranging in thickness from less than a nanometer up to several microns have been added to sheet materials to provide a decorative appearance and/or various physical characteristics such as, for example, conductivity, static charge resistance, chemical resistance, thermal reflectivity or emissivity, and optical reflectivity. In some situations, metallized sheet materials can be applied to or incorporated in some or all portions of a product instead of metallizing the product itself. This may be especially desirable for products that are, for example, large, temperature sensitive, vacuum sensitive, difficult to handle in a metallizing process, or have complex topographies.

Such use of metallized sheet materials has often been restricted by the limitations of the substrate sheet. In the past, metallic coatings have typically been applied to sheet-like substrates that are considered to be relatively stretch-resistant and inelastic so that the substrate would not deform and cause the metallic coating to detach or flake off. Accordingly, such metallized materials may possess inadequate flexibility, elasticity, softness and/or drape properties for many applications. For example, U.S. Pat. Nos. 4,999,222 and 5,057,351 describe metallized polyethylene plexifilamentary film-fibril sheets that are inelastic and have relatively poor drape and softness which may make them unsuited for applications where elasticity, drape and softness are required. European Patent Publication 392,082-A2 describes a method of manufacturing a metallic porous sheet suitable for use as an electrode plate of a battery. According to that publication, metal may be deposited on a porous sheet (foam sheet, nonwoven web, mesh fabric or combinations of the same) utilizing processes such as vacuum evaporation, electrolytic plating and electroless plating.

Thus, a need exists for an elastomeric metallized sheet material which has desirable flexibility, elasticity, drape, and softness. There is a further need for an elastomeric metallized sheet material which has the desired properties described above and which is so inexpensive that it can be discarded after only a single use. Although metallic coatings have been added to inexpensive sheet materials, such inexpensive metallized sheet materials have generally had limited application because of the poor flexibility, elasticity, drape and softness of the original sheet material.

DEFINITIONS

The terms "elastic" and "elastomeric" are used herein to mean any material which, upon application of a biasing force, is stretchable, that is, elongatable, to a stretched, biased length which is at least about 125 percent of its relaxed unbiased length, and which, will recover at least 40 percent of its elongation upon release of the stretching, elongating force. A hypothetical example would be a one (1) inch sample of a material which is elongatable to at least 1.25 inches and which, upon being elongated to 1.25 inches and released, will recover to a length of not more than 1.10 inches. Many elastic materials may be elongated by much more than 25 percent (i.e., much more than 125 percent of their relaxed length), for example, elongated 200 percent or more, and many of these will recover to substantially their initial relaxed length, for example, to within 105 percent of their initial relaxed length, upon release of the stretching force.

As used herein, the term "nonelastic" refers to any material which does not fall within the definition of "elastic," above.

As used herein, the terms "recover" and "recovery" refer to a contraction of a stretched material upon termination of a biasing force following stretching of the material by application of the biasing force. For example, if a material having a relaxed, unbiased length of one (1) inch is elongated 50 percent by stretching to a length of one and one half (1.5) inches, the material would be elongated 50 percent (0.5 inch) and would have a stretched length that is 150 percent of its relaxed length. If this exemplary stretched material contracted, that is recovered to a length of one and one tenth (1.1) inches after release of the biasing and stretching force, the material would have recovered 80 percent (0.4 inch) of its one-half (0.5) inch elongation. Recovery may be expressed as [(maximum stretch length–final sample length) /(maximum stretch length–initial sample length)]×100.

As used herein the term "thermoset material" refers to a high polymer that solidifies or "sets" irreversibly when heated. This property is typically associated with a cross-linking reaction of the molecular constituents induced by heat or irradiation. Phenolics, alkyds, amino resins, polyesters, epoxides, and silicones are usually considered to be thermosets. The term is also meant to encompass materials where additive-induced cross-linking is possible, e.g. cross-linked natural rubber. One method for determining whether a material is "cross-linked" and therefore a thermoset material, is to reflux the material in boiling toluene, xylene or another solvent, as appropriate, for forty (40) hours. If a weight percent residue of at least 5 percent remains, the material is deemed to be cross-linked and thus a thermoset material. Another method to determined whether a polymer is cross-linked and the degree of cross-linking can be determined is by ASTM-D-2765-68 (Reapproved 1978). Yet another method for determining whether a material is cross-linked is to determine the melt flow of the material in accordance with ASTM D 1238-79 at 230 degrees Centigrade while utilizing a 21,600 gram load. Materials having a melt flow of greater than 75 grams per ten minutes shall be deemed to be non-cross-linked and thus would not be considered to be thermoset materials. This method should be utilized to confirm the "gel" method, described above, whenever the remaining insoluble gel content is less than 5% since some cross-linked materials will evidence a residual gel content of less than 5 weight percent. Of course, the term "thermoset material" is also meant to include mixtures and combinations of two or more thermoset materials as well as mixtures and combinations which include at least fifty (50) percent, by weight, thermoset materials.

As used herein the term "thermoplastic material" refers to a high polymer that softens when exposed to heat and returns to its original condition when cooled to room temperature. Natural substances which exhibit this behavior are crude rubber and a number of waxes. Other exemplary thermoplastic materials include, without limitation, polyvinyl chloride, polyesters, nylons, fluorocarbons, linear polyethylene such as linear low density polyethylene, polyurethane pre-polymer, polystyrene, polypropylene, polyvinyl alcohol, caprolactams, and cellulosic and acrylic resins.

As used herein the term "naturally occurring polymeric material" refers to a polymeric material which occurs naturally. The term is meant to include materials, such as cellophane, which can be regenerated from naturally occurring materials, such as, in the case of cellophane, cellulose. Examples of such naturally occurring polymeric materials include, without limitation, (1) polysaccharides such as starch, cellulose, pectin, seaweed gums (such as agar, etc.), vegetable gums (such as arabic, guar, etc.); (2) polypeptides; (3) hydrocarbons such as rubber and gutta percha (polyisoprene) and (4) regenerated materials such as cellophane or chitosan. Of course, the term "naturally occurring polymeric material" is also meant to include mixtures and combinations of two or more naturally occurring polymeric materials as well as mixtures and combinations which include at least fifty (50) percent, by weight, naturally occurring polymeric materials.

As used herein the term "aperture" refers to a generally linear hole or passageway. Aperture is to be distinguished from and does not include holes or passageways having the greatly tortuous path or passageways found in membranes.

As used herein the term "microaperture" refers to an aperture which has an area of less than about 100,000 square micrometers. The area of the microaperture is to be measured at the narrowest point in the linear passageway or hole.

As used herein, the term "stretchably conformable" refers to material having both measurable softness and recoverable stretch. A stretchably conformable material has softness characterized by a drape stiffness in at least one direction of less than about 2.75 cm. For example, a conformable material may have a drape stiffness in at least one direction from less than about 1.5 up to about 2.75 cm. Drape stiffness is determined using a stiffness tester available from Testing Machines, Amityville, Long Island, N.Y. 11701. Test results are obtained in accordance with ASTM standard test D1388-64 using the method described under Option A (Cantilever Test). A conformable material may have measurable softness which is characterized by cup crush test results of less than about 200 grams. For example, a conformable material may have cup crush test results from less than about 150 up to about 200 grams. The cup crush test evaluates film stiffness by measuring the peak load required for a 4.5 cm diameter hemispherically shaped foot to crush a 9"×9" piece of film shaped into an approximately 6.5 cm diameter by 6.5 cm tall inverted cup while the cup shaped film is surrounded by an approximately 6.5 cm diameter cylinder to maintain a uniform deformation of the cup shaped film. The foot and the cup are aligned to avoid contact between the cup walls and the foot which might affect the peak load. The peak load is measured while the foot descends at a rate of about 0.25 inches per second (15 inches per minute) utilizing a Model FTD-G-500 load cell (500 gram range) available from the Schaevitz Company, Tennsauken, N.J.

As used herein, the term "breathable" refers to material having a Frazier porosity of at least about 25 cubic feet per minute per square foot (cfm/ft$^2$). For example, the Frazier porosity of a breathable material may be from about 25 to more than 100 cfm/ft$^2$. The Frazier porosity is determined utilizing a Frazier Air Permeability Tester available from the Frazier Precision Instrument Company. The Frazier porosity is measured in accordance with Federal Test Method 5450, Standard No. 191A, except that the sample size is 8"×8" instead of 7"×7".

As used herein, the term "polymer" generally includes, but is not limited to, homopolymers, copolymers, such as, for example, block, graft, random and alternating copolymers, terpolymers, etc. and blends and modifications thereof. Furthermore, unless otherwise specifically limited, the term "polymer" shall include all possible geometrical configurations of the material. These configurations include, but are not limited to, isotactic, syndiotactic and random symmetries.

As used herein, the term "consisting essentially of" does not exclude the presence of additional materials which do not significantly affect the desired characteristics of a given composition or product. Exemplary materials of this sort would include, without limitation, pigments, surfactants, waxes, flow promoters, particulates and materials added to enhance processability of the composition.

SUMMARY OF THE INVENTION

The present invention addresses the above-described problems by providing an elastic metallized film composed of an elastic film and a metallic coating substantially covering at least a portion of at least one side of the elastic film.

According to one aspect of the present invention, the elastic film component of the elastic metallized film may be a thermoset elastic film, a thermoplastic elastic film, or a naturally occurring elastic polymer film. In one aspect of the present invention, the elastic film may be a microporous elastic film and/or a microapertured elastic film.

The elastic film may be formed from synthetic elastomeric polymers such as, for example, elastic polyesters, elastic polyurethanes, elastic polyamides, elastic copolymers of ethylene and at least one vinyl monomer, and elastic A-B-A' block copolymers wherein A and A' are the same or different thermoplastic polymer, and wherein B is an elastomeric polymer block. The elastomeric polymer may be blended with a processing aid such as, for example, a polyolefin. Alternatively and/or additionally, the elastomeric polymer may be blended with a tackifying resin. In some situations it may be desirable to form the elastic film from naturally occurring elastomeric polymers such as, for example, rubber and gutta percha.

The elastic film used in the present invention may have an average thickness ranging from about 0.25 to about 10 mils. For example, the elastic film may have an average thickness ranging from about 0.8 to about 5 mils. More particularly, the elastic film may have an average thickness ranging from about 1 to about 2 mils. In some embodiments of the present invention it is contemplated that the elastic film may have a thickness much greater than 10 mils (e.g., 30 mils or more).

The elastic film may have one or both surfaces embedded with one or more other materials such as, for example, wood pulp, nonelastic fibers, and particulates. Exemplary nonelastic fibers include polyester fibers, polyamide fibers, glass fibers, polyolefin fibers, cellulosic derived fibers, multi-component fibers, natural fibers, absorbent fibers, electrically conductive fibers or blends of two or more of such fibers. Exemplary particulates include activated charcoal, clays, starches, metal oxides, super-absorbent materials and mixtures of such materials.

Generally speaking, the metallic coating on the elastic film may range from about 1 nanometer to about 5 microns. For example, the metallic coating may range from about 5 nanometers to about 1 micron. More particularly, the metallic coating may range from about 10 nanometers to about 500 nanometers.

In one aspect of the present invention, the elastic metallized film is adapted to retain substantially all of its metallic coating when stretched at least about 25 percent. For example, the elastic metallized film may be adapted to retain substantially all of its metallic coating when stretched 35 percent or more. More particularly, the elastic metallized film may be adapted to retain substantially all of its metallic coating when stretched 100 percent or more.

The metallic coating may cover substantially all of one or both sides of the elastic film or the metallic coating may be limited to portions of one or both sides of the elastic film. For example, the elastic film may be masked during the metal coating process to produce discrete portions of metallized elastic. One or more layers of the same or different metals may be coated onto the elastic film. The coating may be any metal which can be deposited onto an elastic film and which bonds to the film to form a durable coating. Exemplary metals include aluminum, copper, tin, gold, silver and the like. Conventional film finishes may be applied to the elastic metallized film. For example, lacquers or sealants may be applied to the elastic metallized film.

The present invention encompasses multilayer materials which contain at least one layer which is an elastic metallized film. For example, an elastic metallized film may be laminated with one or more other films or nonwoven webs. The elastic metallized film may even be sandwiched between other layers of materials.

According to the present invention, an elastic metallized film may be made by a process which includes the following steps: (1) providing an elastic film; and (2) metallizing at least one side of the elastic film so that at least a portion of the elastic film is substantially covered with a metallic coating.

The metallizing of the elastic film may be accomplished by any process which can be used to deposit metal onto a film and which bonds the metal to the film. The metallizing step may be carried out by techniques such as metal vapor deposition, metal sputtering, plasma treatments, electron beam treatments, and chemical oxidation or reduction reactions. The surface of the elastic film may be modified by flame treatment, plasma discharge or corona discharge treatments to enhance adhesion of the metallic coating to the elastic film before the metallizing step.

According to one embodiment of the process of the present invention, the elastic film may be elongated during the metallizing step. For example, the elastic film may be elongated by 10 percent or more. More particularly, the elastic film may be elongated to about its elastic limit. In another aspect of the present invention, the elastic film may be embossed or pattern bonded either before or after the metallizing step.

DETAILED DESCRIPTION OF THE INVENTION

Figure 1:
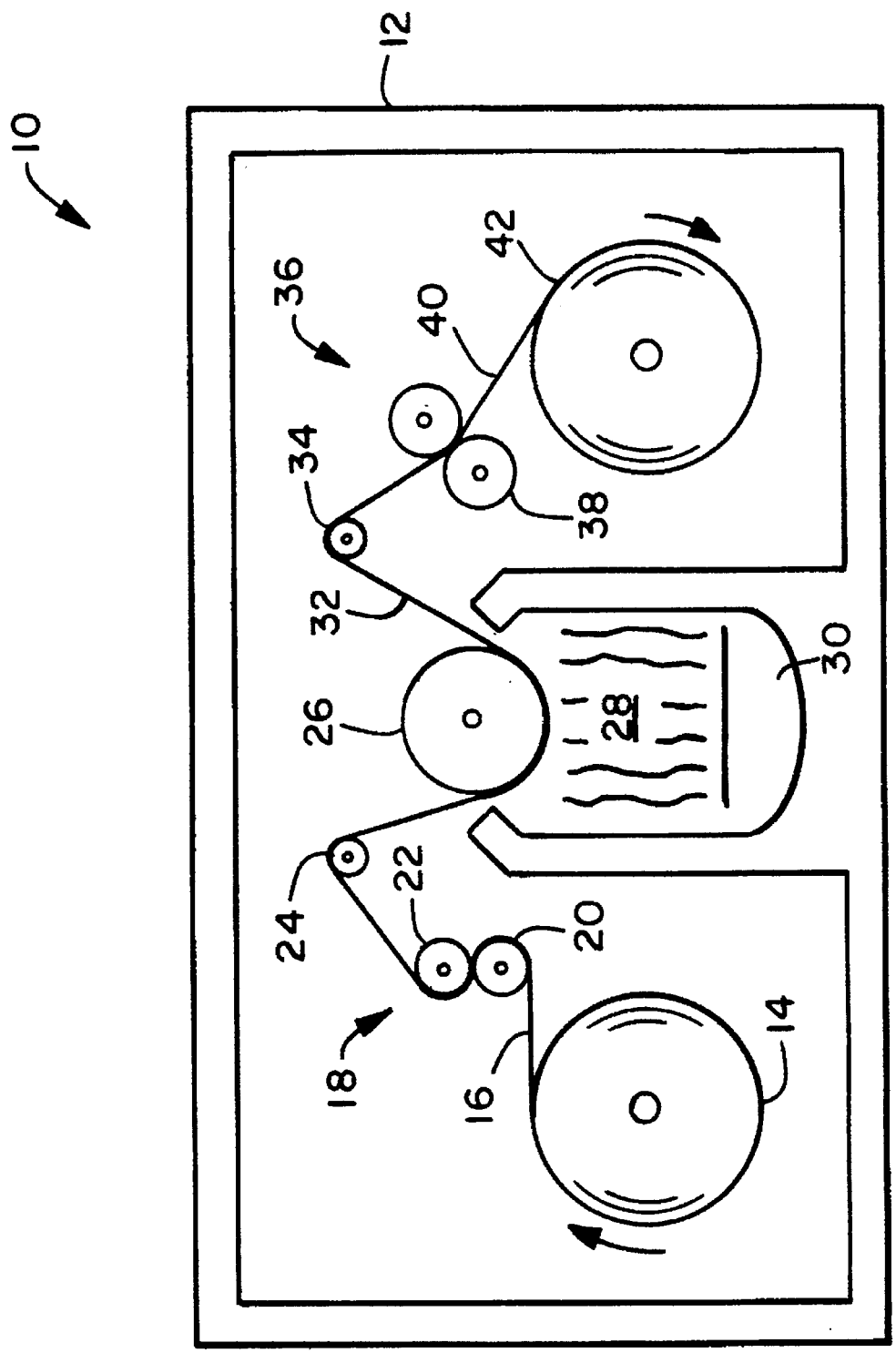
FIG. 1 is an illustration of an exemplary process for making an elastic metallized film.

Referring to the drawings and in particular to FIG. 1, there is shown at 10 an exemplary process of making the elastic metallized film of the present invention within an evacuated chamber 12. Metal vapor deposition typically takes place in the evacuated chamber 12 at an absolute pressure from about $10^{-6}$ to about $10^{-4}$ millimeters Hg (mercury). A supply roll 14 of an elastic film 16 located within the evacuated chamber 12 is unwound. The elastic film 16 travels in the direction indicated by the arrow associated therewith as the supply roll 14 rotates in the direction of the arrow associated therewith. The elastic film 16 passes through a nip of an S-roll arrangement 18 formed by two stack rollers 20 and 22. It is contemplated that the elastic film may be formed by film forming processes such as, for example, conventional film extrusion processes and passed directly through the nip of the S-roll arrangement 18 without first being stored on a supply roll.

From the reverse S path of the S-roll arrangement 18, the elastic film 16 passes over an idler roller 24 and then contacts a portion of a chill roll 26 while the elastic film 16 is exposed to metal vapor 28 emanating from a molten metal bath 30. Metal vapor condenses on the elastic film 16 thereby forming an elastic metallized film 32. Although a chill roll 26 is not required to practice the present invention, it has been found to be useful in avoiding deterioration of the elastic film 16 during exposure to the metal vapor 28. For example, a chill roll would be desirable when the elastic film 16 is exposed to the metal vapor for a relatively long period. Multiple molten metal baths and chill roll arrangements (not shown) may be used in series to apply multiple metallic coatings of the same or different metals. Additionally, the present invention is meant to encompass other types of metallizing processes such as, for example, metal sputtering, electron beam metal vapor deposition and the like. Metal may also be deposited on the elastic film by means of a chemical reaction such as, for example, a chemical reduction reaction. Generally speaking, any process which deposits metal on the elastic film with minimal deterioration of the fabric may be employed. These metallizing processes may be used in combination in the practice of the present invention.

The metallic coating substantially covers at least a portion of at least one side of the elastic film 16. For example, the metallic coating may substantially cover all of one or both sides of the elastic film 16. The elastic film 16 may be masked with one or more patterns during exposure to the metal vapor 28 so that only desired portions of one or both sides of the elastic film have a metallic coating.

The elastic metallized film 32 passes over an idler roller 34 and through the nip of a drive roller arrangement 36 formed by two drive rollers 38 and 40. Because of the peripheral linear speed of the rollers of the S-roll arrangement 18 is controlled to be less than the peripheral linear speed of the rollers of the drive roller arrangement 36, the elastic film 16 is tensioned between the S-roll arrangement 18 and the drive roller arrangement 36. By adjusting the difference in the speeds of the rollers, the elastic film 16 is tensioned so that it stretches the desired amount and is maintained in such stretched condition as it travels over a portion of the chill roll 26 while the elastic film 16 is exposed to the metal vapor 28. Generally speaking, the elastic film 16 may be stretched to any elongation within its elastic limit and maintained in such stretched condition during exposure to the metal vapor 28. For example, elastic polyurethane films available from JPS Elastomerics Corporation of Northampton, Mass. under the trade designation "Thermoplastic Polyurethane" may be stretched from about 5 percent to about 100 percent or more, depending on the material. More particularly, the "Thermoplastic Polyurethane" films may be stretched from about 25 percent to 200 percent. Even more particularly, a 1 mil "Thermoplastic Polyurethane XPR-8 24" film may be stretched from about 30 percent to 90 percent. Of course, it is not necessary for the elastic film 16 to be stretched at all during the metallizing process in order to make the elastic metallized film 32.

If desired, the elastic film 16 may be stretched to a first elongation of, for example, 5 percent or more, and exposed to metal vapor 28 to deposit a metallic coating on the elastic film 16. The film may then be stretched to a different elongation, for example, 50 percent, and exposed to metal vapor (from the same or a different molten metal bath) to deposit a second metallic coating. This step may be repeated any number of times with different combinations of elongations and molten metal baths to produce elastic metallized films having many different variations of metallic coatings.

The elastic metallized film 32 immediately relaxes upon release of the tensioning force provided by S-roll arrangement 18 and the bonder roll arrangement 36, and then the elastic metallized film 32 is wound up on a winder 42.

Conventional film post-treatments may be applied to the elastic metallized film providing they do not harm the metallic coating. For example, shellacs or sizing may be applied.

Generally speaking, the elastic film may be any elastic film which can survive the metallizing process and provide an elastic metallized film having good stretch and recovery properties. For example, the elastic film may be a thermoplastic elastic film, a thermoset elastic film or a naturally occurring polymeric elastic film. These elastic films may also be microporous and/or microapertured.

Desirably, the elastic film component of the elastic metallized film is an thermoplastic elastic film. Generally, any suitable elastomeric film forming resins or blends containing the same may be utilized for the nonwoven webs of elastomeric fibers of the invention. For example, useful elastic film forming resins include block copolymers having the general formula A-B-A' or A-B, where A and A' are each a thermoplastic polymer endblock which contains a styrenic moiety such as a poly (vinyl arene) and where B is an elastomeric polymer midblock such as a conjugated diene or a lower alkene polymer. Block copolymers of the A-B-A' type can have different or the same thermoplastic block polymers for the A and A' blocks, and the present block copolymers are intended to embrace linear, branched and radial block copolymers. In this regard, the radial block copolymers may be designated (A-B)$_m$—X, wherein X is a polyfunctional atom or molecule and in which each (A-B)$_m$— radiates from X in a way that A is an endblock. In the radial block copolymer, X may be an organic or inorganic polyfunctional atom or molecule and m is an integer having the same value as the functional group originally present in X. It is usually at least 3, and is frequently 4 or 5, but not limited thereto. Thus, in the present invention, the expression "block copolymer", and particularly "A-B-A'" and "A-B" block copolymer, is intended to embrace all block copolymers having such rubbery blocks and thermoplastic blocks as discussed above, which can be extruded (e.g., by meltblowing), and without limitation as to the number of blocks. The elastic nonwoven web may be formed from, for example, elastomeric (polystyrene/poly(ethylene-butylene)/polystyrene) block copolymers available from the Shell Chemical Company under the trademark KRATON G. One such block copolymer may be, for example, KRATON G-1657.

Other exemplary elastomeric materials which may be used to form elastic films include polyurethane elastomeric materials such as, for example, those available under the trademark ESTANE from B. F. Goodrich & Co., polyamide elastomeric materials such as, for example, those available under the trademark PEBAX from the Rilsan Company, and polyester elastomeric materials such as, for example, those available under the trade designation Hytrel from E. I. DuPont De Nemours & Company. Formation of elastic sheets from polyester elastic materials is disclosed in, for example, U.S. Pat. No. 4,741,949 to Morman et al., hereby incorporated by reference. Elastic films may also be formed from elastic copolymers of ethylene and at least one vinyl monomer such as, for example, vinyl acetates, unsaturated aliphatic monocarboxylic acids, and esters of such monocarboxylic acids. The elastic copolymers and formation of elastic sheets from those elastic copolymers are disclosed in, for example, U.S. Pat. No. 4,803,117.

Processing aids may be added to the elastomeric polymer. For example, a polyolefin may be blended with an elastomeric polymer (e.g., an A-B-A elastomeric block copolymer) to improve the processability of the composition. Extrudable blends of elastomeric polymers and polyolefins are disclosed in, for example, U.S. Pat. No. 4,663,220 to Wisneski et al., hereby incorporated by reference.

The elastic film may also be a pressure sensitive elastomer adhesive film. For example, the elastic material itself may be tacky or, alternatively, a compatible tackifying resin may be added to the extrudable elastomeric compositions described above to provide an elastomeric film that can act as a pressure sensitive adhesive, e.g., to bond the elastomeric film to a tensioned, reversibly necked nonelastic web or to enhance to tenacity of the metallic coating. In regard to the tackifying resins and tackified extrudable elastomeric compositions, note the resins and compositions as disclosed in U.S. Pat. No. 4,789,699, hereby incorporated by reference.

Any tackifier resin can be used which is compatible with the elastomeric polymer and can withstand high processing (e.g., extrusion) temperatures. The tackifier resins should also be able to withstand conditions encountered while the elastic film is being metallized. For example, if physical vapor deposition is used, the tackifier resin should be relatively stable during the brief exposure to heat and high vacuum so as not to produce significant amounts of vapor which could interfere with the metallizing process. If the elastomeric polymer (e.g., A-B-A elastomeric block copolymer) is blended with processing aids such as, for example, polyolefins or extending oils, the tackifier resin should also be compatible with those processing aids. The elastic film may also be a multilayer material in that it may include two or more individual films and/or nonwoven webs. Additionally, the elastic film may be a multilayer material in which one or more of the layers is a nonwoven web that contains a mixture of elastic and nonelastic fibers or particulates. An example of the latter type of elastic web, reference is made to U.S. Pat. No. 4,209,563, incorporated herein by reference, in which elastomeric and non-elastomeric fibers are commingled to form a single coherent web of randomly dispersed fibers. Another example of such an elastic composite web would be one made by a technique such as disclosed in previously referenced U.S. Pat. No. 4,741,949 and in U.S. Pat. Nos. 4,100,324 and 4,803,117, the contents of each of which are incorporated herein by reference in their entirety. Other types of nonwoven elastomeric composite webs may be used. For example, a hydraulically entangled nonwoven elastomeric composite web may be used such as disclosed in U.S. Pat. Nos. 4,879,170 and 4,939,016 both to Radwanski, et al. the contents of which are incorporated herein by reference in their entirety.

The elastic film of the present invention may have an average thickness that is at least about 0.25 mil. For example, the average thickness of the elastic film may range from about 0.25 mil to about 10 mils. More particularly, the average thickness of the elastic film may range from about 0.25 mil to about 5 mils. Even more particularly, the average thickness of the elastic film may range from about 0.5 mil to about 1 mil. Generally speaking, average thickness of the film, before metallizing, is determined by randomly selecting five (5) locations on a given sheet material, measuring the thickness of the sheet material at each location to the nearest 0.1 mil, and averaging the five values (sum of the five values divided by five). Each thickness measurement is determined utilizing a Mitutoyo Corporation dial thickness gauge No. 2804-10 available from the Mitutoyo Corporation of Japan.

The elastic film used in the process of the present invention may be a microporous elastic film and/or a microapertured elastic film. Microporous and/or microapertured films may be desirable for certain applications because they can be used to provide a material having desirable physical characteristics such as, for example, air and/or vapor permeability. Generally speaking, any method of forming microporous and/or microapertured film may be used to treat the elastic film before it is metallized.

Various microporous films and methods of making such films are known in the art. For example, microporous films are disclosed in U.S. Pat. No. 3,795,720, the contents of which are incorporated by reference.

Different types of microapertured films and microaperturing processes have been developed and may be used in the practice of the present invention. For example, films are disclosed in U.S. patent application Ser. No. 07/769,050 entitled "Hydrosonically Microapertured Thin Thermoset Sheet Materials"; U.S. patent application Ser. No. 07/769,047 entitled "Hydrosonically Microapertured Thin Thermoplastic Sheet Materials"; U.S. patent application Ser. No. 07/768,788 entitled "Hydrosonically Microapertured Thin Naturally Occurring Polymeric Sheet Materials and Method of Making the Same"; and U.S. Pat. No. 5,269,981 entitled "Process For Hydrosonically Microapuring Thin Sheet Materials". All of these applications are assigned to the assignee of the present application and are hereby incorporated by reference.

Generally speaking, such hydrosonically microapertured films may be made by a method which involves the application of ultrasonic vibrations to a material where the area of such application is has had a liquid applied thereto to the extent that the liquid is present in sufficient quantity to generally fill the gap between the tip of the ultrasonic horn and the surface of the material. The method of hydrosonic microaperturing includes the steps of: (1) placing an elastic film on a pattern anvil having a pattern of raised areas where the height of the raised areas is greater than the thickness of the elastic film; (2) conveying the elastic film, while placed on the pattern anvil, through an area where a fluid is applied to the elastic film; and (3) subjecting the elastic film to ultrasonic vibrations in the area where the fluid is applied to the elastic film. As a result of this method, the elastic film is microapertured in a pattern generally the same as the pattern of raised areas on the pattern anvil.

The area of the microapertures in the microapertured elastic films may generally range from at least about 10 square micrometers to about 100,000 square micrometers. For example, the area of each of the formed microapertures may generally range from at least about 10 square micrometers to about 5,000 square micrometers. More particularly, the area of each of the formed microapertures may generally range from at least about 10 square micrometers to about 1,000 square micrometers. Even more particularly, the area of each of the formed microapertures may generally range from about at least 10 square micrometers to about 100 square micrometers.

The elastic film may be microapertured with a microaperture density of at least about 1,000 microapertures per square inch. For example, the elastic film may be microapertured with a microaperture density of at least about 5,000 microapertures per square inch. More particularly, the elastic film may be microapertured with a microaperture density of at least about 20,000 microapertures per square inch. Even more particularly, the elastic film be microapertured with a microaperture density of at least about 90,000 microapertures per square inch. Yet even more particularly, the elastic film may be microapertured with a microaperture density of at least about 160,000 microapertures per square inch. In some embodiments it may be desirable for the microaperturing of the elastic film to be confined to a predesignated area or areas of the elastic film.

Other films that can be used in the present invention may contain valve systems that respond to changes in pressure such as disclosed in U.S. patent application Ser. No. 07/768,782 entitled "Pressure Sensitive Valve System and Process For Forming Said System". Films having portions which have been thinned but not apertured may also be used in the present invention. Such film are disclosed in, for example, U.S. Pat. No. 5,314,737 entitled "Process For Hydrosonically Area Thinning Thin Sheet Materials". Other films which may be used include, for example, films having fibers or particulates embedded onto at least one surface of the film. Examples of soft materials include, without limitation, certain thermoplastic film materials and certain materials derived from natural materials. Some experimentation is necessary because if the material is too hard fibers and/or particulates cannot be embedded therein. Conversely, if the material is too elastic fibers and particulates cannot be embedded because, it is believed, they bounce off of the material during hydrosonic processing. Useful embedded films are disclosed in, for example, U.S. patent application Ser. No. 07/768,494 entitled "Hydrosonically Embedded Soft Thin Film Materials and Process For Forming Said Materials".

The elastic film may be pre-treated before the metallizing step. For example, the elastic film may be calendered with a flat roll, point bonded or pattern bonded in order to achieve desired physical and/or textural characteristics. Additionally, at least a portion of the surface of the elastic film may be modified by various known surface modification techniques to alter the adhesion of the metallic coating to the elastic film. Exemplary surface modification techniques include, for example, chemical etching, chemical oxidation, ion bombardment, plasma treatments, flame treatments, heat treatments, and corona discharge treatments.

One important feature of the present invention is that the elastic metallized film is adapted to retain substantially all of its metallic coating when stretched at least about 25 percent. That is, there is little or no flaking or loss of metal observable to the unaided eye when an elastic metallized film of the present invention covered with at least at low to moderate levels of metallic coating is subjected to normal handling. For example, an elastic metallized film having a metallic coating from about 5 nanometers to about 500 nanometers may be adapted to retain substantially all of its metallic coating when stretched from about 30 percent to more than 100 percent. More particularly, such an elastic metallized film may be adapted to retain substantially all of its metallic coating when stretched from about 35 percent to about 75 percent.

The thickness of the deposited metal depends on several factors including, for example, exposure time, the pressure inside the chamber, temperature of the molten metal, surface temperature of the film, size of the metal vapor "cloud", and the distance between the elastic film and molten metal bath, the number of passes over through the metal vapor "cloud", and the speed of the moving film. Generally speaking, lower process speeds tend to correlate with heavier or thicker metallic coatings on the film but lower speeds increase the exposure time to metal vapor at temperatures which may deteriorate the elastic film. Under some process conditions, exposure times can be less than about 1 second, for example, less than about 0.75 seconds or even less than about 0.5 seconds. Any number of passes through the metal vapor "cloud" may be used to increase the thickness of the metallic coating.

The elastic film is generally metallized to a metal thickness ranging from about 1 nanometer to about 5 microns. Desirably, the thickness of the metallic coating may range from about 5 nanometers to about 1 micron. More particularly, the thickness of the metallic coating may be from about 10 nanometer to about 500 nanometers.

Any metal which is suitable for physical vapor deposition or metal sputtering processes may be used to form metallic coatings on the elastic film. Exemplary metals include aluminum, copper, tin, zinc, lead, nickel, iron, gold, silver and the like. Exemplary metallic alloys include copper-based alloys (e.g., bronze, monel, cupro-nickel and aluminum-bronze); aluminum based alloys (aluminum-silicon, aluminum-iron, and their ternary relatives); titanium based alloys; and iron based alloys. Useful metallic alloys include magnetic materials (e.g., nickel-iron and aluminum-nickel-iron) and corrosion and/or abrasion resistant alloys.

FIGS. 2–5 are scanning electron microphotographs of exemplary elastic metallized films of the present invention. The elastic metallized films shown in FIGS. 2–5 were made from conventional commercially available elastic films. A metal coating was added to the webs utilizing conventional techniques. The scanning electron microphotographs were obtained directly from the metal coated film without the pre-treatment conventionally used in scanning electron microscopy.

Figure 2:
FIG. 2 is a photomicrograph of an unstretched example of an elastic metallized film which was coated while in an unstretched condition.
Figure 3:
FIG. 3 is a photomicrograph of a portion of the exemplary elastic metallized film shown in FIG. 2 held in a stretched condition.

More particularly, FIG. 2 is a 888× microphotograph of an elastic natural rubber film with a metallic aluminum coating. The sample was metallized while it was in the unstretched condition and is shown in the microphotograph in the unstretched condition. FIG. 3 is a 888× microphotograph of a portion of the material shown in FIG. 2 while the material was stretched about 100 percent.

Figure 4:
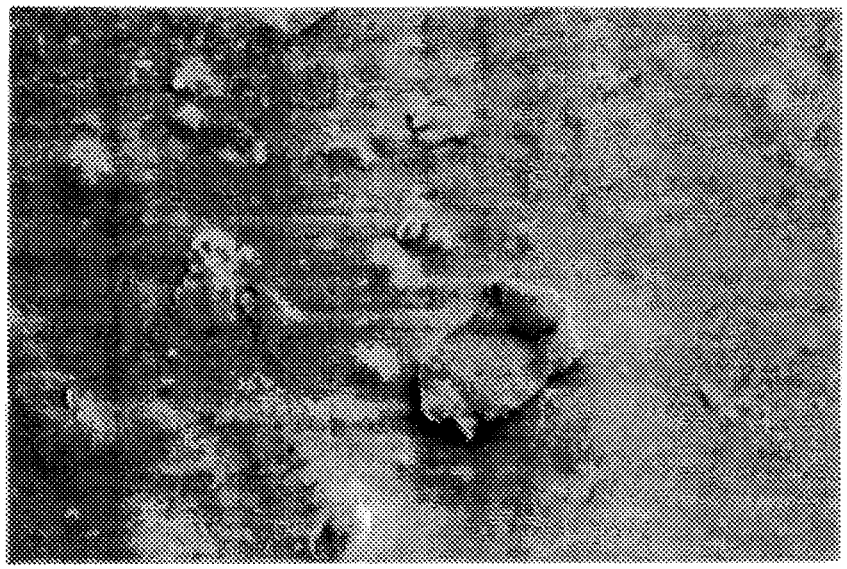
FIG. 4 is a photomicrograph of an unstretched example of an elastic metallized film.
Figure 5:
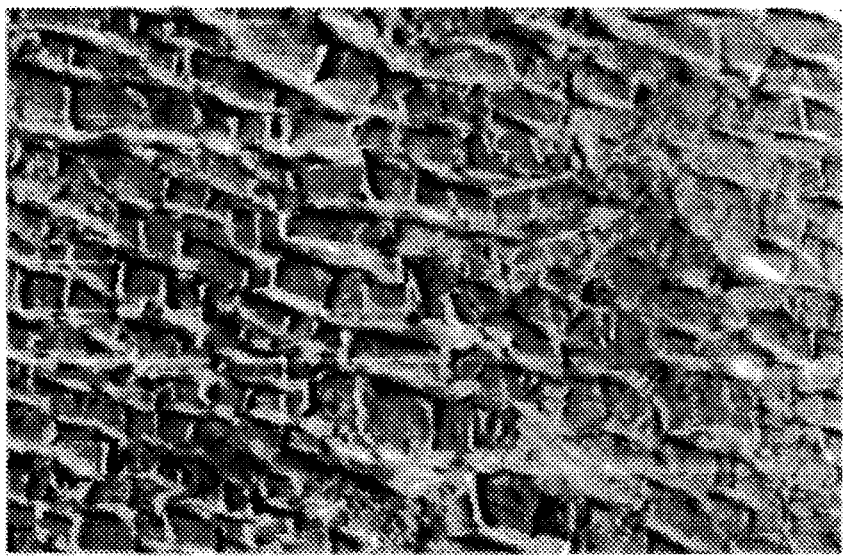
FIG. 5 is a photomicrograph of a portion of the exemplary elastic metallized film shown in FIG. 4 held in a stretched condition.

FIG. 4 is a 888× microphotograph of an elastic urethane film having a metallic aluminum coating. The elastic nonwoven web was coated while it was in the unstretched condition, and the microphotograph shows the elastic metallized film in the unstretched condition. FIG. 5 is a 888× microphotograph of a portion of the material shown in FIG. 4 while the material was stretched about 100 percent.

Figure 6:
FIG. 6 is a photomicrograph of a cross section of an exemplary elastic metallized film.
Figure 7:
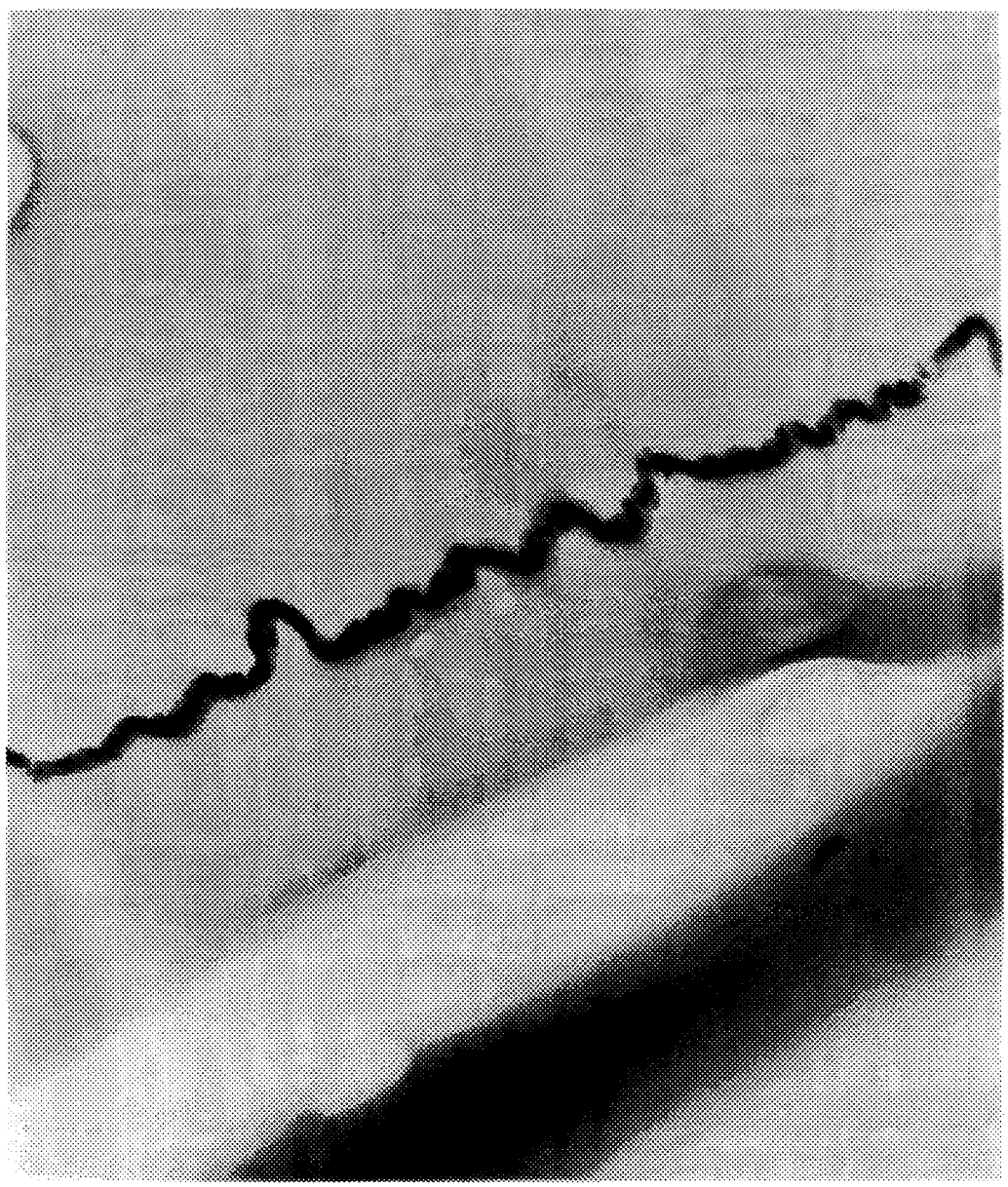
FIG. 7 is an enlarged photomicrograph of a portion of the exemplary elastic metallized film shown in FIG. 6.
Figure 8:
FIG. 8 is a photomicrograph of a cross section of another exemplary elastic metallized film.

FIGS. 6–8 are transmission electron microphotographs of exemplary elastic metallized films of the present invention. The transmission electron microphotographs were made utilizing a JEOL 1200EX transmission electron microscope operated at 100 kV. Microphotographs were made from ultra thin cross sections of metal coated samples.

FIG. 6 is a 7,500× transmission electron microphotograph of an aluminum coated urethane film. It should be noted that the urethane coated urethane samples partially dissolved in the epoxy embedment used to confine the sample so that it could be sliced into ultra thin cross sections. FIG. 7 is a 30,000× microphotograph of a portion of the material shown in FIG. 6. As can be seen from the cross sections of FIGS. 6 and 7, a very dense continuous surface coating of aluminum having a thickness of approximately 10 nanometers is visible. The urethane film itself appears to have a thickness of about 100 to about 200 nanometers.

FIG. 8 is a 30,000× transmission electron microphotograph of an aluminum coated natural rubber film. It should be noted that the metallized natural rubber samples embedded quite poorly and sectioned poorly during the procedure used to obtain ultra thin cross sections. There appears to be disrupted areas which may be composed of multiple micro fine layers of metal.

EXAMPLES

Example A

A sample of an elastic film of natural rubber was coated with aluminum metal utilizing a conventional small scale vacuum metallizing process. The elastic film had an average thickness (before coating) of about 4 mils and was in the form of a sample which measured approximately 7 inches×7 inches. The elastic film sample was placed in an NRC-3176 laboratory vacuum metallizer available from NRC Corporation of Newton, Mass. The sample was taped to the side of the vacuum chamber of the vacuum metallizer. The chamber containing the sample was pumped down to about $10^{-4}$ Torr (i.e., millimeters of Hg) and a current was applied to an aluminum wire to produce aluminum vapor in the vacuum chamber. The vapor condensed on the surface on the sample to produce a metallic coating. The amount of metal deposited on the sample (i.e., degree of deposition) was judged by placing a piece of a clear film (e.g., poly-vinyl chloride) over a sight glass port in the vacuum chamber and viewing the deposition on the clear film. The operation was stopped when the clear film was covered with metal so that the view through the sight glass port was obstructed. Generally speaking, the clear film was covered with metal during the deposition process in a relatively short time, on the order of minutes. Some samples were run on both sides by repeating this operation after turning the samples over. When the elastic metallized film was removed from the vacuum chamber, there was little or no flaking or loss of metal observable to the unaided eye during normal handling. FIGS. 2, 3 and 8 are photomicrographs of materials made according to Example A.

Example B

The procedure of Example A was repeated utilizing a 1 mil elastic polyurethane film available from the JPS Elastomerics Corporation of Northampton, Mass. under the trade designation Thermoplastic Polyurethane XPR-824 film. Samples of the elastic metallized film were examined using a scanning electron microscope and photographs of stretched and unstretched material obtained. FIGS. 4, 5, 6 and 7 are photomicrographs of materials made according to Example B.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

RELATED APPLICATIONS

This patent application is one of a group of commonly assigned patent applications which are being filed on the same date. The group includes the present application and application Ser. No. 07/849,854 abandoned entitled "An Elastomeric Metallized Fabric and Process to Make the Same" in the name of Bernard Cohen. The subject matter of that application is hereby incorporated by reference.

What is claimed is:

1. A multilayer elastic metallized material comprising:
   a pressure sensitive elastomer adhesive film having an average thickness ranging from about 0.25 to about 30 mils;
   a metallic coating substantially covering at least a portion of at least one side of the pressure sensitive elastomer adhesive film, and
   an elastic nonwoven web of meltblown fibers,
   so that upon application of a stretching force, the multilayer elastic metallized material is adapted to retain substantially all of its metallic coating when stretched from about 30 percent to more than 100 percent.

2. The multilayer elastic metallized material of claim 1 wherein the pressure sensitive elastomer adhesive film is a thermoset film.

3. The multilayer elastic metallized material of claim 1 wherein the pressure sensitive elastomer adhesive film is a thermoplastic film.

4. The multilayer elastic metallized material of claim 1 wherein the pressure sensitive elastomer adhesive film is a microporous film.

5. The multilayer elastic metallized material of claim 1 wherein the pressure sensitive elastomer adhesive film is a micro-apertured film.

6. The multilayer elastic metallized material of claim 1 wherein the pressure sensitive elastomer adhesive film comprises an elastomeric polymer selected from the group consisting of elastic polyesters, elastic polyurethanes, elastic polyamides, elastic copolymers of ethylene and at least one vinyl monomer, and elastic A-B-A' block copolymers wherein A and A' are the same or different thermoplastic polymer, and wherein B is an elastomeric polymer block.

7. The multilayer elastic metallized material of claim 6 wherein the elastomeric polymer is blended with a processing aid.

8. The multilayer elastic metallized material of claim 6 wherein the elastomeric polymer is blended with a tackifying resin.

9. The multilayer elastic metallized material of claim 8 wherein the blend further includes a processing aid.

10. The multilayer elastic metallized material of claim 1 wherein the pressure sensitive elastomer adhesive film further comprises at least one other comminuted material embedded into at least one surface of the film.

11. The multilayer elastic metallized material of claim 10 wherein the comminuted material is selected from the group consisting of wood pulp, nonelastic fibers, particulates and mixtures of the same.

12. The multilayer elastic metallized material of claim 11, wherein the nonelastic fibers are selected from the group consisting of polyester fibers, polyamide fibers, glass fibers, polyolefin fibers, cellulosic derived fibers, multi-component fibers, natural fibers, absorbent fibers, electrically conductive fibers and blends of two or more of said nonelastic fibers.

13. The multilayer elastic metallized material of claim 11, wherein the particulate materials are selected from the group consisting of activated charcoal, clays, starches, metal oxides, and super-absorbent materials.

14. The multilayer elastic metallized material of claim 1 wherein the pressure sensitive elastomer adhesive film has an average thickness ranging from about 0.8 to about 10 mils.

15. The multilayer elastic metallized material of claim 14 wherein the pressure sensitive elastomer adhesive film has an average thickness ranging from about 1 to about 2 mils.

16. The multilayer elastic metallized material of claim 1 wherein the metallic coating is selected from the group consisting of aluminum, copper, tin, zinc, lead, nickel, iron, gold, silver, copper based alloys, aluminum based alloys, titanium based alloys, and iron based alloy.

17. The multilayer elastic metallized material of claim 16 wherein the metallic coating comprises multiple layers.

18. The multilayer elastic metallized material of claim 1 wherein the thickness of the metallic coating ranges from about 1 nanometer to about 5 microns.

19. The multilayer elastic metallized material of claim 18 wherein the thickness of the metallic coating ranges from about 5 nanometers to about 1 micron.

20. The multilayer elastic metallized material of claim 19 wherein the thickness of the metallic coating ranges from about 10 nanometer to about 500 nanometers.

21. The multilayer elastic metallized material of claim 1 wherein the pressure sensitive elastomer adhesive film is adapted to retain substantially all of its metallic coating when stretched from about 35 percent to about 75 percent.

* * * * *